US007945863B1

(12) United States Patent (10) Patent No.: US 7,945,863 B1
Reid et al. (45) Date of Patent: May 17, 2011

(54) LOCALIZED EXPLODED VIEW

(75) Inventors: Dexter Reid, San Francisco, CA (US); Narciso B. Jaramillo, San Francisco, CA (US); Mark Anders, San Francisco, CA (US)

(73) Assignee: Adobe Systems Incorporated, San Jose, CA (US)

( * ) Notice: Subject to any disclaimer, the term of this patent is extended or adjusted under 35 U.S.C. 154(b) by 1149 days.

(21) Appl. No.: 11/175,114

(22) Filed: Jul. 5, 2005

(51) Int. Cl.
*G06F 3/048* (2006.01)
*G06F 3/00* (2006.01)
*G09G 5/00* (2006.01)

(52) U.S. Cl. ........ 715/797; 715/762; 715/763; 715/767; 345/651; 345/660; 345/665; 345/671

(58) Field of Classification Search .................. 715/763, 715/762, 767, 797; 345/660, 661, 665, 671, 345/651
See application file for complete search history.

(56) References Cited

U.S. PATENT DOCUMENTS

| 5,463,725 | A | * | 10/1995 | Henckel et al. ............... 715/776 |
| 5,528,744 | A | | 6/1996 | Vaughton |
| 5,652,901 | A | * | 7/1997 | Slayden et al. ............... 715/209 |
| 5,689,666 | A | * | 11/1997 | Berquist et al. ............... 715/797 |
| 5,828,371 | A | * | 10/1998 | Cline et al. .................... 715/836 |
| 5,880,743 | A | * | 3/1999 | Moran et al. .................. 345/473 |
| 5,911,145 | A | * | 6/1999 | Arora et al. ................... 715/207 |
| 5,917,492 | A | | 6/1999 | Bereiter et al. |
| 5,943,053 | A | | 8/1999 | Ludolph et al. |
| 5,963,204 | A | * | 10/1999 | Ikeda et al. ................... 715/723 |
| 6,002,397 | A | * | 12/1999 | Jaaskelainen, Jr. ........... 715/805 |
| 6,014,138 | A | * | 1/2000 | Cain et al. ...................... 715/826 |
| 6,031,989 | A | | 2/2000 | Cordell |
| 6,088,708 | A | | 7/2000 | Burch et al. |
| 6,239,798 | B1 | * | 5/2001 | Ludolph et al. ............... 715/788 |
| 6,337,698 | B1 | * | 1/2002 | Keely et al. ................... 715/823 |
| 6,694,487 | B1 | | 2/2004 | Ilsar |
| 6,763,497 | B1 | | 7/2004 | Softky |
| 7,076,733 | B2 | | 7/2006 | Smith |
| 7,081,882 | B2 | * | 7/2006 | Sowden et al. ............... 345/156 |
| 7,113,190 | B2 | * | 9/2006 | Heaton ......................... 345/440 |
| 7,149,960 | B1 | | 12/2006 | Brooks et al. |
| 7,248,269 | B2 | * | 7/2007 | Card et al. .................... 345/660 |
| 7,395,525 | B2 | | 7/2008 | Softky |
| 7,472,343 | B2 | | 12/2008 | Vasey |

(Continued)

OTHER PUBLICATIONS

Microsoft® Office Specialist Study Guide—Office 2003 Edition, by Joyce Cox, Joan Preppernau, and Online Training Solutions Inc., published by Microsoft Press on Jun. 23, 2004 (hereinafter Office 2003). Relevant pages are 130-132, 638, and 639, retrieved Jul. 3, 2010 from Safari Books Online <http://proquest.safaribooksonline.com/0735621101>.*

(Continued)

*Primary Examiner* — William L Bashore
*Assistant Examiner* — Stephen Alvesteffer
(74) *Attorney, Agent, or Firm* — Kilpatrick Townsend & Stockton LLP

(57) ABSTRACT

A method for providing an Integrated Development Environment comprises receiving input from a user identifying an area containing an edge shared by two or more objects, wherein the shared edge includes two or more individual edges corresponding to the objects, and visibly separating the two or more individual edges in a localized exploded view responsive to the receiving.

17 Claims, 6 Drawing Sheets

U.S. PATENT DOCUMENTS

| | | | |
|---|---|---|---|
| 2002/0070953 A1* | 6/2002 | Barg et al. | 345/700 |
| 2002/0140736 A1* | 10/2002 | Chen | 345/777 |
| 2002/0188632 A1 | 12/2002 | Su | |
| 2003/0043177 A1 | 3/2003 | Kawai | |
| 2003/0071849 A1 | 4/2003 | Ferri | |
| 2003/0160832 A1 | 8/2003 | Ridgley et al. | |
| 2004/0008228 A1 | 1/2004 | Smith | |
| 2004/0205514 A1* | 10/2004 | Sommerer et al. | 715/501.1 |
| 2005/0283734 A1 | 12/2005 | Santoro et al. | |
| 2006/0015804 A1 | 1/2006 | Barton et al. | |
| 2006/0031754 A1 | 2/2006 | Lehenbauer et al. | |
| 2006/0161868 A1* | 7/2006 | Van Dok et al. | 715/835 |
| 2006/0282766 A1 | 12/2006 | Parsell | |
| 2007/0162953 A1* | 7/2007 | Bolliger et al. | 725/142 |
| 2007/0277149 A1 | 11/2007 | Stevens | |
| 2008/0016472 A1 | 1/2008 | Rohlf et al. | |
| 2008/0270933 A1 | 10/2008 | Straw et al. | |
| 2009/0031247 A1 | 1/2009 | Walter et al. | |

OTHER PUBLICATIONS

Wayback Machine, "W3schools Division Tutorial", http://web.archive.org/web/20030801072752/http://www.w3schools.com/tags/tag_div.asp. Published Aug. 1, 2003, 3 pgs.

Wayback Machine, "W3schools CSS Margin Tutorial", http://web.archive.org/web/20031210134241/http://www.w3schools.com/css/css_margin.asp. Published Dec. 10, 2003, 3 pgs.

Wayback Machine, "W3schools CSS Border Tutorial", http;//web.archive.org/web/20031204195615/http://www.w3schools.com/css/css_border.asp. Published Dec. 4, 2003, 7 pgs.

Office Action mailed Nov. 9, 2009 in related U.S. Appl. No. 10/927,963.

Advisory Action mailed Feb. 1, 2010 in related U.S. Appl. No. 10/927,963.

Notice of Allowance mailed Aug. 2, 2010 in U.S. Appl. No. 11/546,002.

Examiner's Answer mailed Jul. 12, 2010 in U.S. Appl. No. 10/927,963.

* cited by examiner

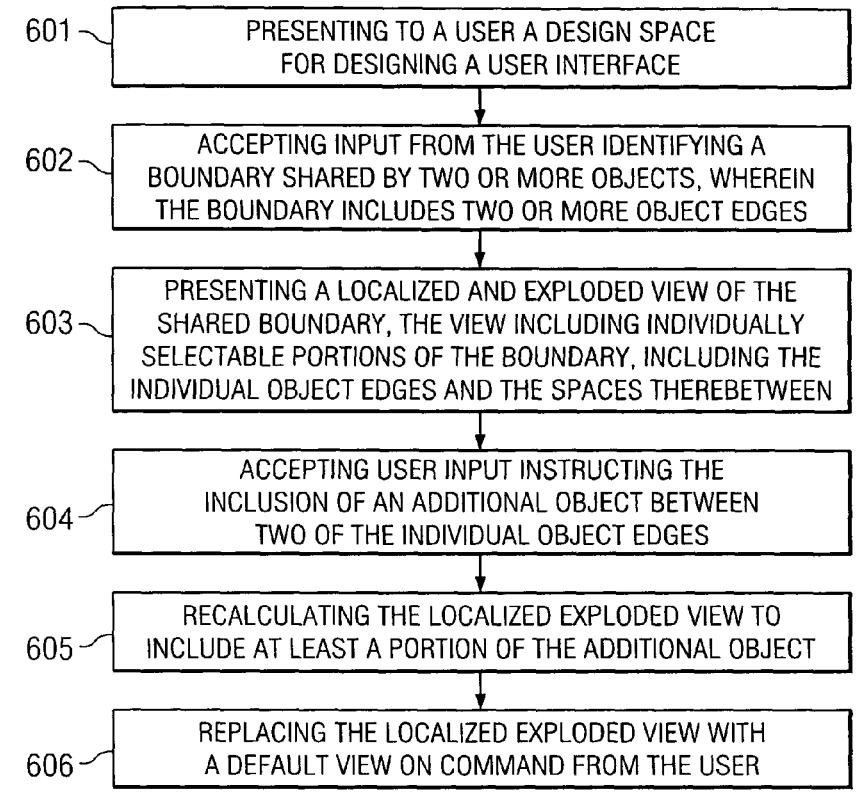
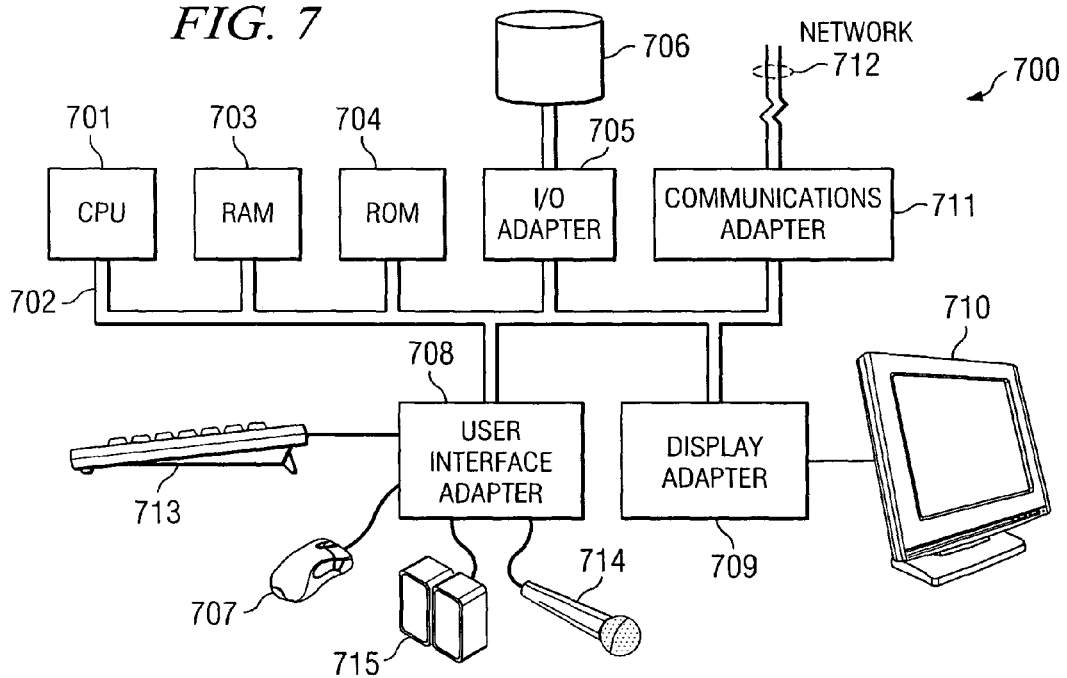

LOCALIZED EXPLODED VIEW

CROSS-REFERENCE TO RELATED APPLICATIONS

This application is related to U.S. patent application Ser. No. 10/927,963, the disclosure of which is hereby incorporated by reference herein.

TECHNICAL FIELD

The present invention relates, in general, to Integrated Development Environments (IDEs) and, more specifically, to Graphical User Interface (GUI) tools for IDEs.

BACKGROUND OF THE INVENTION

Integrated Development Environments (IDEs) are software tools that allow a developer (e.g., a web developer) to create web pages, websites, interactive applications, and the like for use by end users (e.g., visitors to websites). Various IDEs exist in the current marketplace, such as DREAMWEAVER™ and FLEX™, both available from MACROMEDIA INC. of San Francisco, Calif. DREAMWEAVER™ is an IDE that allows web developers to design Hypertext Markup Language (HTML) web pages in both a code editor and a graphical-based design time environment. DREAMWEAVER™ also allows the developer to design in other languages, such as, for example, ASP, CFML™, and the like. FLEX™ is a presentation layer server that has an IDE associated with it for creating Rich Internet Applications (RIAs), which are interactive, multimedia, applications, that may run on client-side players or containers, for example, MACROMEDIA INC.'s FLASH™ player. FLEX™ utilizes MACROMEDIA INC.'s MXML™, an Extensible Markup Language (XML)-based language, to describe RIAs. Much of a developer's job is to create user interfaces (UIs) for the applications that are easy to use and enhance a user's experience.

The rich interface screens defined with MXML™ often include container objects to hold visual objects that are rendered in the resulting interface screens. In other words, a container may be considered to be an organizational unit for automatically laying out the visual elements of a UI. Thus, while an end user usually will not see container objects themselves in the application, the container objects are present, organizing and laying out the visual elements. In an MXML™ IDE, example container constructs include an HBox, VBox, form, form item, panel, tile, grid, grid row or item, title window, control bar, HDividedBox, VDividedBox, application, and the like. Each of these constructs define containers which, for example, position content horizontally (e.g., an HBox) and/or vertically (e.g., a VBox). Containers for HTML applications include, for example, table, DIV, and the like.

An example of a container in use is illustrated in FIG. 1. FIG. 1 presents screen shot 100 of a design view of an example IDE. Container 101 is an HBox (i.e., horizontal box), which is a type of container that is used to align several objects horizontally in a UI. For example, a developer who is designing a UI for playing multimedia animation may desire to insert control button objects 102-105 into the UI to allow a user to control the playing of the content. In the design view of FIG. 1, a developer may drag buttons 102-105 to container 101 and drop them in, wherein container 101 automatically aligns them such that there is a substantially uniform space between each button 102-105 and between the buttons 102-105 and the borders of container 101.

When nesting multiple containers in a UI in order to achieve an overall layout, many developers encounter a problem. For example, a UI under development may have a horizontal box to lay objects out horizontally and one or more vertical boxes which lay objects out vertically, wherein the vertical boxes are placed inside the horizontal box such that the vertical boxes can be laid across horizontally. Several of these containers will have shared edges. For example, the left edge of a VBox that is inside an HBox is the same as the left edge of the HBox. If the developer desires to insert another VBox before the current left-most VBox, the shared edge will not allow access to the virtual space between the left-most VBox and the left edge of the HBox because the shared edge appears as a single edge, rather than two edges with a space between them.

A previous solution has been to create a viewing mode wherein each edge of all container objects is given a space buffer that allows a developer to select the space between objects for editing or modification. The viewing mode allows objects to be placed between what would otherwise be presented as shared edges. Embodiments including this previous solution are described in commonly-assigned U.S. patent application Ser. No. 10/927,963. A problem with such a solution is that the expanded edge view presented to the developer is not a What You See Is What You Get (WYSIWYG) view because it is not a true representation of the UI at runtime. Further, it can be a slow algorithm when it involves recomputing the size of the objects and the positions of the spaces between the edges every time a new object is added, resized, or moved.

BRIEF SUMMARY OF THE INVENTION

The present invention is directed to a system and method that provide fine-grained selection or insertion of objects when container objects are close together or nested. Various embodiments of the present invention provide a localized expanded view of shared edges. As used herein, "localized" includes views that are limited to one or more portions of the design canvas. Accordingly, a user may select a shared edge, and the IDE program may present an exploded view of the shared boundary without exploding other boundaries that are not of interest to the developer at that particular time. Therefore, such various embodiments provide for an expanded view of object edges without requiring a separate viewing mode.

In an exemplary embodiment, a developer uses a mouse or other pointing device to select a shared boundary from among several shared boundaries in his or her workspace. The program then superimposes a window or transparent layer on a portion of the design canvas. This window includes an exploded and/or magnified view of the shared boundary, such that there is a space buffer placed between each of the individual edges. The developer may then drag and drop an object, such as another container object or a visual object, into a space buffer. Because the window covers only a portion of the workspace, other objects may be visible to the designer in WYSIWYG to give him or her context and continuity when inserting an object into the limited and exploded view.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 6 is a flowchart illustrating exemplary method 600, which may be performed by an IDE program; and FIG. 7 illustrates example computer system 700, adapted according to embodiments of the present invention.

DETAILED DESCRIPTION OF THE INVENTION

Figure 1:
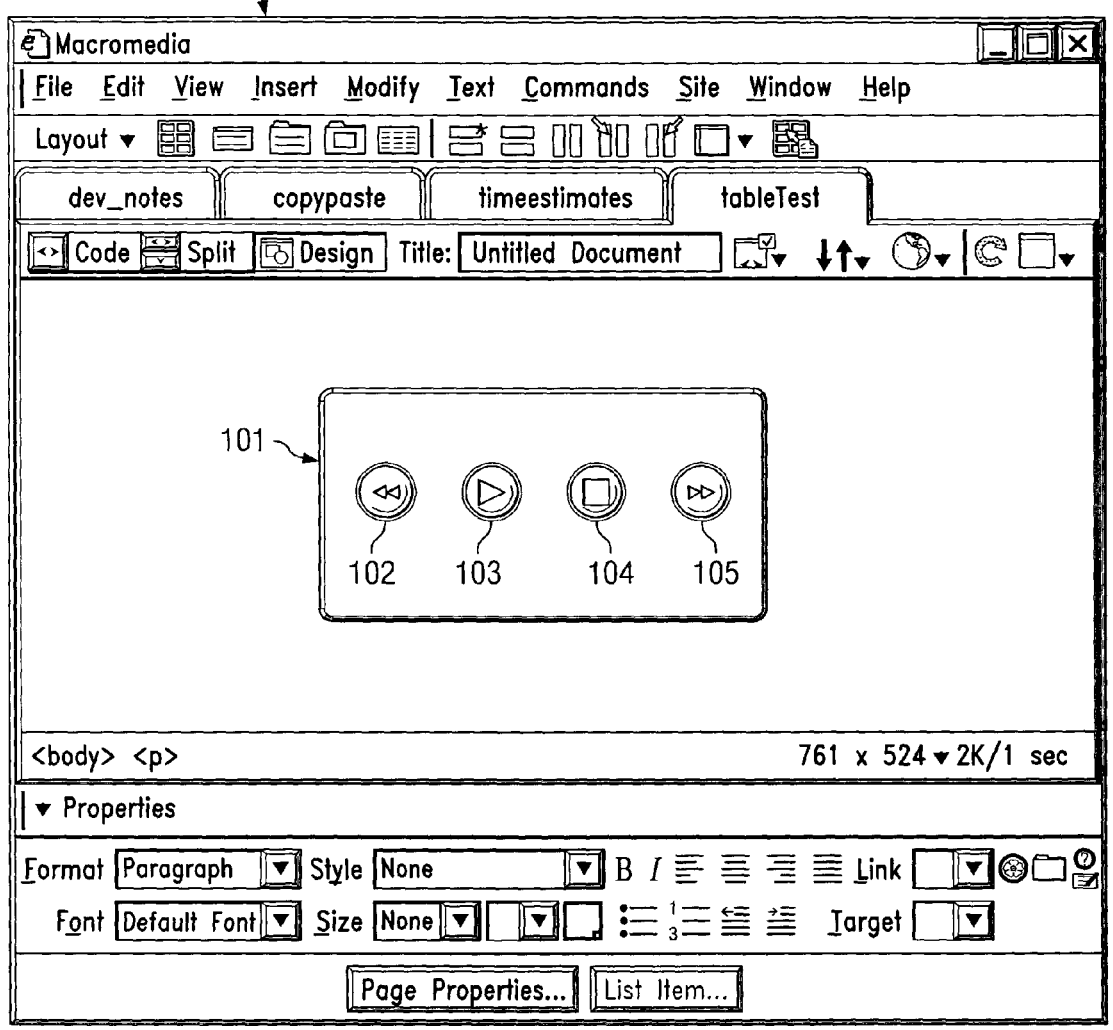
FIG. 1 presents screen shot 100 of a design view of an example IDE, adapted according to various embodiments of the invention.
Figure 2:
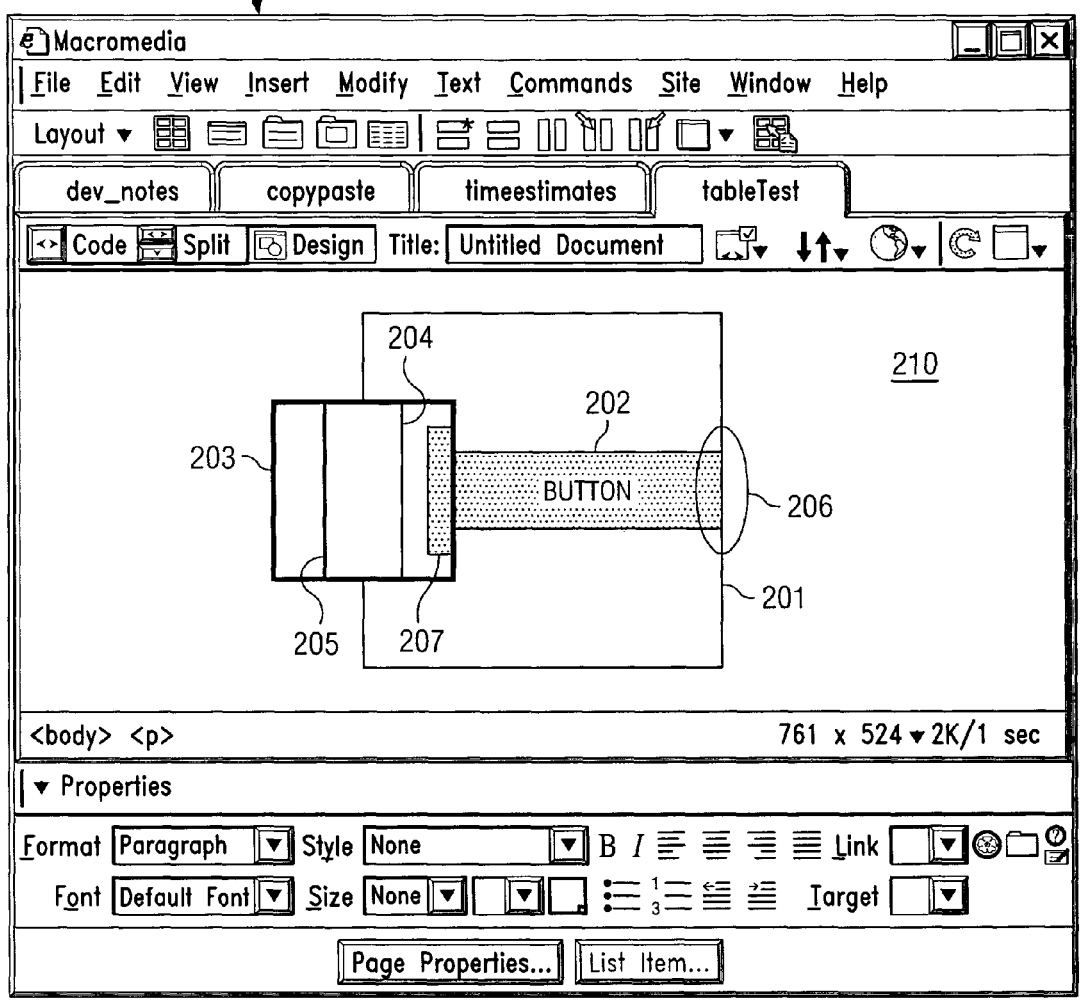
FIG. 2 presents screen shot 200 of an example IDE, adapted according to embodiments of the present invention.

FIG. 2 presents screen shot 200 of an example IDE, adapted according to one embodiment of the present invention. The IDE includes design canvas 210 in which horizontal box (HBox) 201 is located. Inside HBox 201 is a second HBox that includes button 202. The second HBox is not expressly shown, but is understood to coincide with the outside edge of button 202. The length of button 202 is from the right edge to the left edge of HBox 201; however, its full expanse at the left edge is obscured by localized exploded view 203, explained more fully below. Example MXML™ code to produce the HBoxes and button 202 may include the following:

<mx:HBox>
　<mx:HBox>
　<mx:Button label="button"/>
　</mx:HBox>
</mx:HBox>

Thus, as seen in design canvas 210, HBox 201 includes another HBox nested therein that includes button 202. Because the inner HBox has the same horizontal length as HBox 201, those two HBoxes include two shared edges—one on the right, and one on the left. Right shared edge 206 is visible as a single boundary, while the left shared edge is obscured by localized exploded view 203, as explained below. Because right shared edge 206 appears as a single boundary, it would be difficult to place another container or object between the right edge of HBox 201 and the right edge of the HBox that contains button 202 due to the lack of a space between those two individual edges. Moreover, it would be difficult, if not impossible, to select one of the HBoxes for editing when the two edges are shared.

Localized exploded view 203 is a mechanism that offers a developer a way to view each individual container either to insert an object, such as another container or a visual object, between one or more shared edges, select one of the containers, or the like. Localized exploded view 203 is a magnified view that magnifies and explodes the left shared edges of the two HBoxes and button 202 to allow a developer to more easily access and/or view the space between individual edges 204 and 205, that would otherwise be rendered as a single boundary. The view is localized in that it is limited to the selected shared edge or area around the edge. In localized exploded view 203, edge 204 corresponds to the HBox that contains button 202, and edge 205 corresponds to HBox 201. In same view 203, edge 205 of HBox 201 is rendered on the outside of edge 204 since the two HBoxes have a hierarchical container relationship wherein HBox 201 contains the HBox with edge 204 that accommodates button 202. Additionally, exploded view 203 also explodes the boundary between button 202 and its HBox such that button edge 207 is separated from edge 204.

Localized exploded view 203 may allow a developer to drag and drop an object into the space between edges 204 and 205. Therefore, if the developer desires to insert another HBox, he or she can do so, even though the shared edge would otherwise be rendered as a single boundary. For convenience, edge 205 is rendered in a thicker line to identify it as the edge corresponding to the highest container in the hierarchy. Other embodiments may offer a tool-tip type of feature that visually indicates the appropriate corresponding container when the user places the cursor over a given edge in the exploded view.

Localized exploded view 203 is rendered as a pop-up window that takes up only a fraction of the area of design canvas 210 in order to avoid obscuring the containers and visual objects with which the user is presently working. A variety of user gestures and inputs to cause the IDE to produce localized exploded view 203 are discussed more fully with regard to FIG. 6. Additionally, localized exploded view 203 is magnified for convenience of the developer. Alternative embodiments may not magnify the area of interest, but may simply add padding space to the containers in order to get a visual separation in the container edges. Additional and/or alternative embodiments may offer magnification as a choice.

Figure 3:
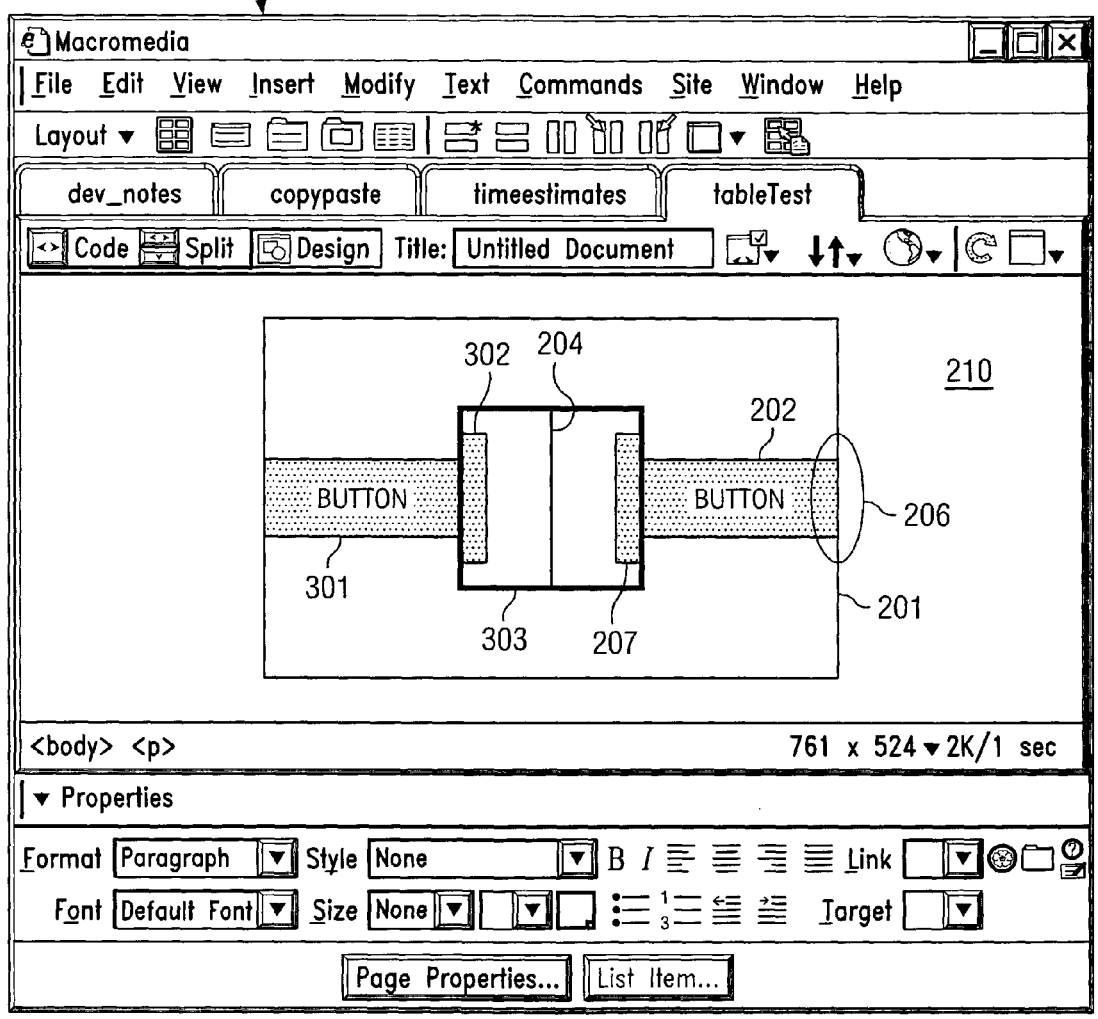
FIG. 3 presents screen shot 300 of a design view of an example IDE, adapted according to various embodiments of the invention.

FIG. 3 presents screen shot 300 of a design view of an example IDE, adapted according to various embodiments of the invention. The objects in design canvas 210 of FIG. 3 represent a configuration that would be produced if a developer inserted button 301 between edges 205 and 204 of FIG. 2. In other words, button 301 is contained in HBox 201, but not in a container lower in the hierarchy, while button 202 is contained inside a nested HBox. Example, code to produce the boxes and buttons in MXML™ may include the following:

<mx:HBox>
　<mx:Button label="button"/>
　<mx:HBox>
　<mx:Button label="button"/>
　</mx:HBox>
</mx:HBox>

In FIG. 3, the developer has instructed the IDE to produce localized exploded view 303 over the shared boundary of button 301 and button 202. Accordingly, localized exploded view 303 shows edge 302 of button 301 set apart from edge 204 of the innermost HBox. (As in FIG. 2, edge 204 corresponds to the innermost HBox that contains button 202. That HBox, itself, is contained in top-level HBox 201.) Further, edge 204 is set apart from edge 207. The developer is then free to drag and drop other objects into the spaces between edges 302, 204, and 207. One of the additional benefits of this feature is that the developer is able to view and/or select various containers or objects.

Figure 4:
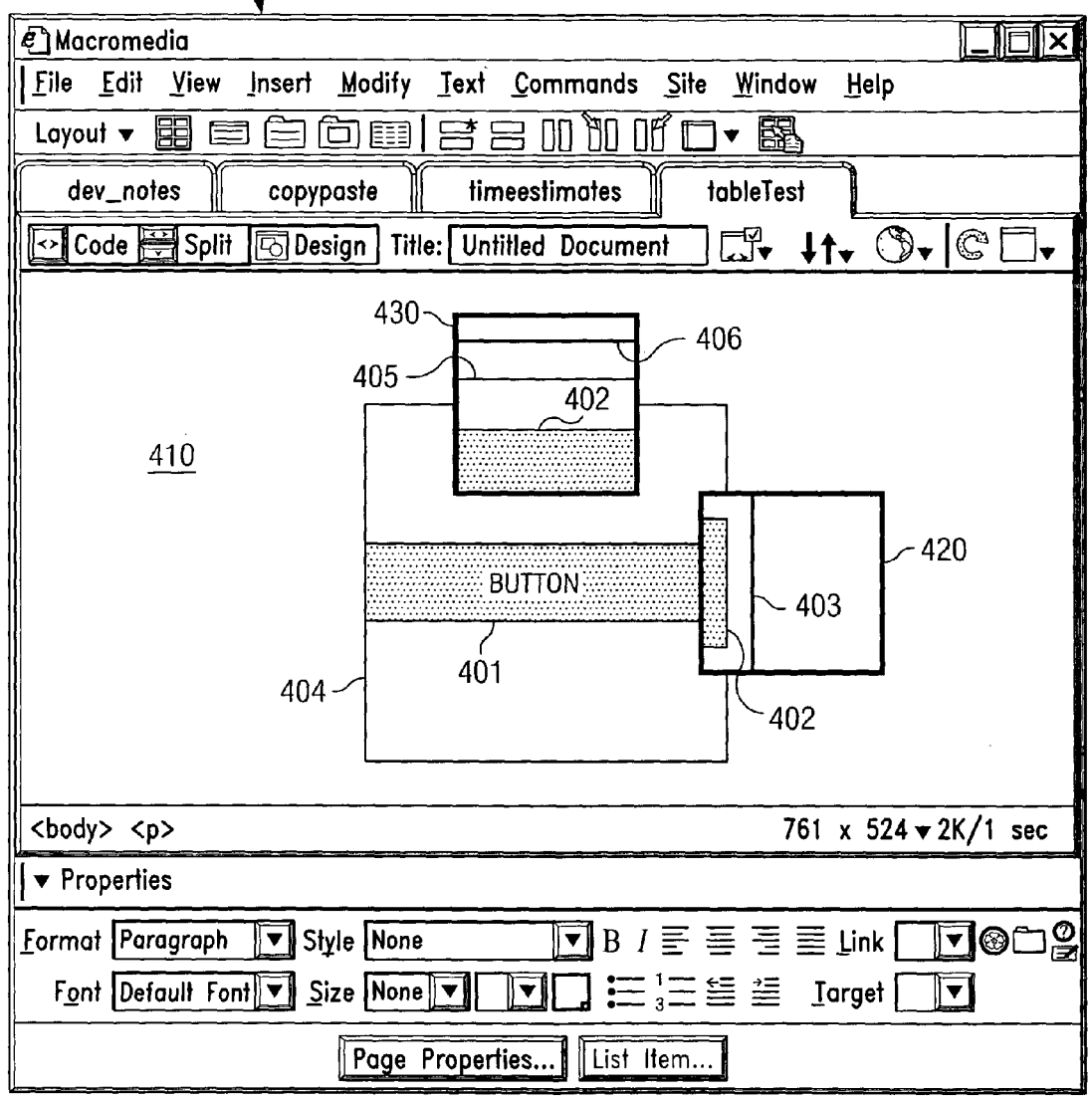
FIG. 4 presents screen shot 400 of a design view of an example IDE, adapted according to various embodiments of the invention

FIG. 4 presents screen shot 400 of a design view of an example IDE, adapted according to various embodiments of the invention. The objects in design canvas or space 410 include top-level vertical box (VBox) 404. VBox 404 includes a nested VBox (shown through its edge in localized exploded view 420). The inside VBox contains a nested HBox that contains button 401. In other words, the objects include button 401 nested inside an HBox nested inside a first VBox nested inside top-level VBox 404. Such a configuration may be produced with the following example MXML™ code:

```
<mx:VBox>
   <mx:VBox>
   <mx:HBox>
   <mx:Button label="button"/>
   </mx:HBox>
   </mx:VBox>
</mx:VBox>
```

Localized exploded view 420 sets edges 402 and 403 (corresponding to button 401 and its HBox, respectively) apart so that a developer may view or insert an object between button 402 and its HBox. In this example, an exploded view on a lateral side of the objects (such as view 420) only explodes boundaries of horizontal objects for convenience. Localized exploded view 430 explodes the edges of button 401 and the nested VBoxes. Accordingly, a developer may be able to drag and drop objects between edges 402, 405, and 406. Edge 406 corresponds to the outermost VBox, and edge 405 corresponds to the inside nested VBox. In this case, an exploded view on a top or bottom side of objects (such as view 430) shows only the boundaries of vertical objects for convenience. In alternate embodiments, various exploded views may show edges of both horizontal and vertical containers.

Figure 5:
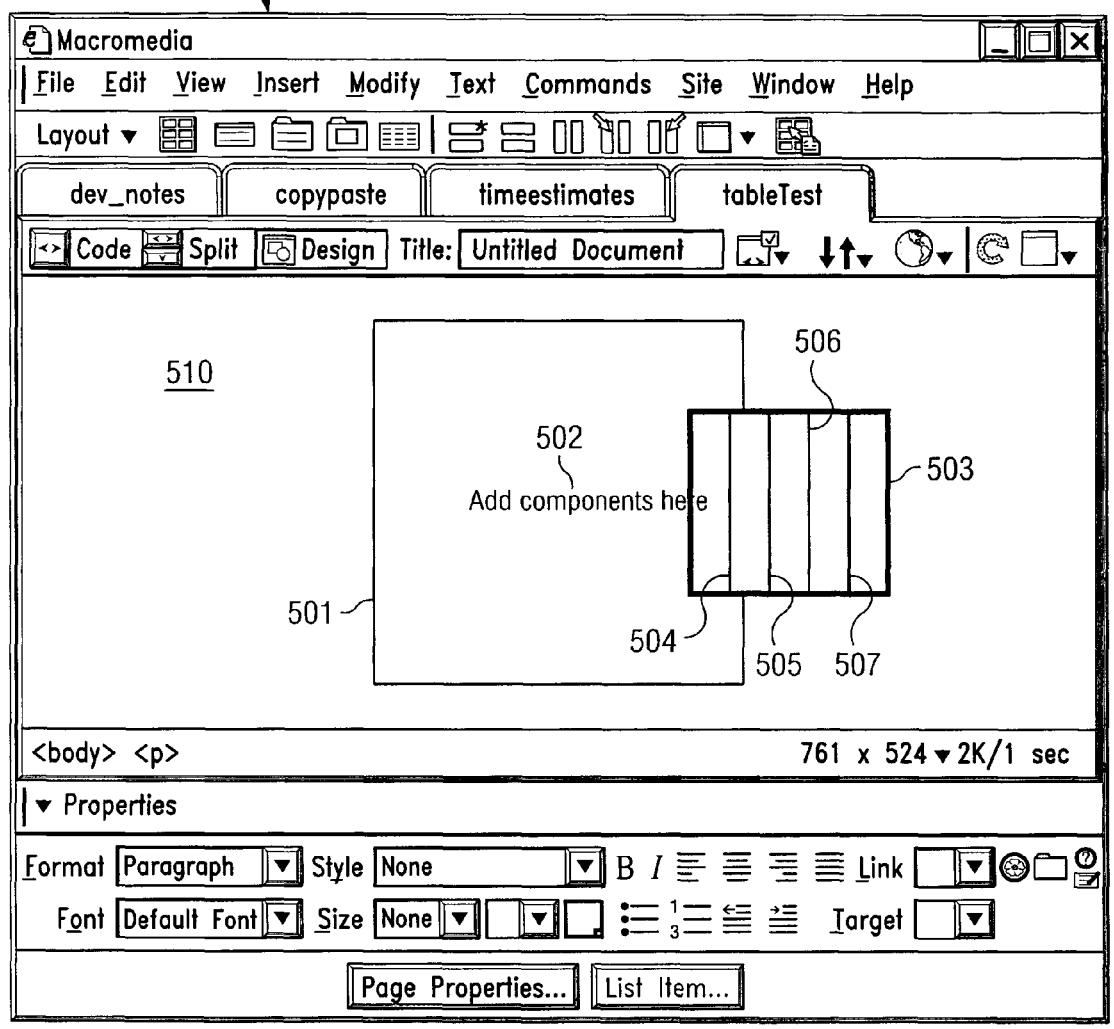
FIG. 5 presents screen shot 500 of a design view of an example IDE, adapted according to various embodiments of the invention.

FIG. 5 presents screen shot 500 of a design view of an example IDE, adapted according to various embodiments of the invention. The configuration of objects in design canvas 510 includes HBox 501, a second HBox nested therein, a third HBox nested in the second HBox, a fourth HBox nested in the third HBox, and text located inside the fourth HBox. Such an arrangement of HBoxes may be produced with the following example MXML™ code:

```
<mx:HBox>
   <mx:HBox>
   <mx:HBox>
   <mx:HBox/>
   </mx:HBox>
   </mx:HBox>
</mx:HBox>
```

Because there are four nested HBoxes, what appears to be the right edge of HBox 501 is a shared edge that includes four individual edges—one for each HBox. Accordingly, localized exploded view 503 sets edges 504-507 apart, thereby making each edge and the spaces therebetween individually selectable. In contrast to the localized exploded views in FIGS. 2-4, localized exploded view 503 does not include magnification.

While the example portions of code above describe possible MXML™ implementations of the illustrated containers, the invention is not limited to MXML™ implementations only. Various embodiments of the invention may include code from one or more of HTML, Java™, .NET, Extensible Application Markup Language (XAML), and/or the like to implement the containers and objects.

FIG. 6 is a flowchart illustrating exemplary method 600, which may be performed by an IDE program configured according to embodiments of the present invention. In step 601, the IDE presents to a user a design canvas for designing a UI. The design canvas may be, for example, a design view in FLEX™ that approximates a run time view of the application as it is being designed, and the user may be a web developer or other person involved in the development/design of a web page or Rich Internet Application (RIA).

In step 602, the IDE accepts input from the user identifying a boundary shared by two or more objects, wherein the boundary includes two or more object edges. For example, one or more container objects may have shared boundaries as presented in the design canvas. The user then identifies the boundary or the area around the boundary. The user may identify the boundary by using a mouse or other computer pointing device to hover a cursor over the boundary to be selected. Alternatively, the user may hold down a hot key, such as the control key, while left-clicking a mouse to identify the boundary. Still further, the user may drag an object to be inserted over the shared edge, thereby indicating an imminent drag and drop in the shared boundary. The invention is not limited in the way that the user may identify or select the boundary, and other methods to identify the boundary are within the scope of various embodiments.

In step 603, the IDE presents a localized and exploded view of the shared boundary, the view including individually selectable portions of the boundary. Presenting the localized and exploded view may include placing space, padding, or the like between the containers to separate the individual object edges so that each of the individual edges and the spaces therebetween are accessible. In other words, the localized exploded view may allow the user to select the boundaries and spaces and also to manipulate the boundaries and spaces, for example, by changing one or properties of an individual edge.

In the embodiments shown in FIGS. 2-5, presenting a localized and exploded view includes superimposing a pop-up window on top of the objects. However, the invention is not limited to pop-up windows. For example, the localized exploded view may include an exploded view of the entire length or a portion of the shared boundary not constrained to a window, while still being limited to the particular selected shared boundary. This differs from an expanded view mode by expanding only the selected boundary, rather than all boundaries in the design view. Highlighting may be added to the exploded view to indicate which edge is associated with a given container. Further, such an exploded view may be made semi-opaque and overlapping the area around it so as to avoid rearranging the other objects on the screen to accommodate the extra space needed by the exploded boundary. Additionally, some embodiments may present an animation to the user showing the edges separating from each other. Such an animation may make it clear to the user which edges are being separated.

In step 604, the IDE accepts user input instructing the inclusion of an additional object between two of said individual edges. This may include, for example, allowing the user to drag and drop an object in the space between two of the edges. In an embodiment wherein the user selects the boundary by dragging an object over it, steps 602 and step 604 may be performed at the same time. Other user methods to instruct an inclusion of an additional object are within the scope of the various embodiments.

In step 605, the IDE recalculates the localized exploded view to include at least a portion of the additional object. In other words, in some embodiments, the IDE may allow for the localized exploded view to survive the inclusion of the object for convenience of the user. In an embodiment that uses pop-up windows, the view inside the window may be recalculated to depict the new arrangement of the objects, and the view may include a portion or all of the inserted object. The new view may even omit some edges that were in the first exploded view due to limited space in the window. In embodiments that do not use a pop-up window, the additional object may be shown with a space buffer between it and its neighboring boundaries. These and other various ways to recalculate the exploded view after an insertion of an object exist and are within the scope of various embodiments.

In step 606, the IDE replaces the localized exploded view with a default view on command from said user. The default view may be simply a view in which no edges are exploded. In some embodiments, the user may indicate to the IDE by, for example, clicking on a "close" button of a pop-up window, that the exploded view is no longer needed. In such a case, the IDE may return to a non-exploded view that is recalculated to take into account any modification made by the user while in the exploded view. The user may also toggle a button in a toolbar that turns off localized exploded views. Further, some embodiments may provide for returning to a non-exploded view automatically whenever an object is inserted—in those embodiments, steps 604-606 may be performed at the same time. Other user methods to indicate a return to a non-exploded view exist are within the scope of the various embodiments.

While method 600 is presented and described as a series of steps, it is merely exemplary, as alternative embodiments may differ. For example, some steps may be performed out of order or at the same time, as in an embodiment that performs steps 602 and 604 at the same time. Another example alternative embodiment provides the user with a localized exploded view that surrounds the cursor and explodes everything within a predetermined area of the cursor as the cursor moves around the work canvas. Other embodiments may also add or delete steps. Further, the examples given above with regard to FIGS. 2-5 show HBoxes and VBoxes; however, the invention is not limited only to HBoxes and VBoxes. Various embodiments may apply to other containers in other development languages, including form, form item, panel, tile, grid, grid row or item, title window, and the like.

Other embodiments may also allow a user to have more than one localized and exploded view on the design canvas at a given time. Also, while the examples above show only a single shared edge in a given localized exploded view, other embodiments may provide for exploding more than one boundary in a given view. For example, a localized exploded view of a corner may explode two or more shared edges.

While the examples given above relate mainly to IDEs, the invention is applicable to other visual layout systems involving hierarchical containment. For example, the invention may be applied to Computer Aided Design (CAD) programs to allow a user to insert an object between two closely spaced or nested objects. In fact, any kind of drawing program that includes nested objects may benefit from one or more embodiments of the invention. Further, any kind of IDE, including HTML, CFML™, .NET, XAML, and Java™ authoring tools, may benefit from various embodiments.

An advantage of some embodiments over previous solutions is allowing the user to see the objects in the design canvas in an approximate WYSIWYG fashion, while still offering localized precision for placement and manipulation of some objects. It may also save the user from having to switch viewing modes, thereby providing a continuous feel to the design canvas. Further, an IDE may not have to recalculate an arrangement for an entire design canvas in embodiments that utilize pop-up windows to display the localized exploded view, since the exploding and/or magnifying would take place entirely within the pop-up window. Reducing recalculations may enhance performance of the IDE by putting less burden on the computer processor, thereby speeding up other calculations and causing user interactions to appear instantaneous.

When implemented via computer-executable instructions, various elements of embodiments of the present invention are in essence the software code defining the operations of such various elements. The executable instructions or software code may be obtained from a readable medium (e.g., a hard drive media, optical media, EPROM, EEPROM, tape media, cartridge media, flash memory, ROM, memory stick, and/or the like) or communicated via a data signal from a communication medium (e.g., the Internet). In fact, readable media can include any medium that can store or transfer information.

FIG. 7 illustrates example computer system 700 adapted according to embodiments of the present invention. That is, computer system 700 comprises an example system on which embodiments of the present invention may be implemented. Central processing unit (CPU) 701 is coupled to system bus 702. CPU 701 may be any general purpose CPU. However, the present invention is not restricted by the architecture of CPU 701 as long as CPU 701 supports the inventive operations as described herein. CPU 701 may execute the various logical instructions according to embodiments of the present invention. For example, CPU 701 may execute machine-level instructions according to the exemplary operational flows described above in conjunction with FIG. 6.

Computer system 700 also preferably includes random access memory (RAM) 703, which may be SRAM, DRAM, SDRAM, or the like. Computer system 700 preferably includes read-only memory (ROM) 704 which may be PROM, EPROM, EEPROM, or the like. RAM 703 and ROM 704 hold user and system data and programs, as is well known in the art.

Computer system 700 also preferably includes input/output (I/O) adapter 705, communications adapter 711, user interface adapter 708, and display adapter 709. I/O adapter 705, user interface adapter 708, and/or communications adapter 711 may, in certain embodiments, enable a user to interact with computer system 700 in order to input information, such as, for example, hovering a cursor to select a shared boundary.

I/O adapter 705 preferably connects to storage device(s) 706, such as one or more of hard drive, compact disc (CD) drive, floppy disk drive, tape drive, etc. to computer system 700. The storage devices may be utilized when RAM 703 is insufficient for the memory requirements associated with storing data for program 703. Communications adapter 711 is preferably adapted to couple computer system 700 to network 712 (e.g., the Internet). User interface adapter 708 couples user input devices, such as keyboard 713, pointing device 707, and microphone 714 and/or output devices, such as speaker(s) 715 to computer system 700. Display adapter 709 is driven by CPU 701 to control the display on display device 710 to, for example, display the design canvas (as in FIGS. 2-5) of embodiments of the present invention.

It shall be appreciated that the present invention is not limited to the architecture of system 700. For example, any suitable processor-based device may be utilized, including without limitation personal computers, laptop computers, computer workstations, and multi-processor servers. Moreover, embodiments of the present invention may be implemented on application specific integrated circuits (ASICs) or very large scale integrated (VLSI) circuits. In fact, persons of ordinary skill in the art may utilize any number of suitable structures capable of executing logical operations according to the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
receiving input from a user identifying an area containing an edge shared by a first object and a second object displayed in a layer of a design application, the design application provided by a computing system, wherein said shared edge includes two or more individual edges corresponding to said first and second objects due to the first and second objects being horizontally adjacent, vertically adjacent, or the second object being positioned inside the first object;
visibly separating said two or more individual edges in a localized exploded view responsive to said receiving;
allowing said user to modify two or more of said individual edges; and
allowing said user to place an additional object between two of said individual edges.

2. The method of claim 1 wherein said individual edges appear as a single edge object and are not individually selectable before said individual edges are visibly separated.

3. The method of claim 1 wherein said individual edges and one or more spaces between said individual edges are selectable.

4. The method of claim 1, wherein said input is generated by said user hovering a cursor over the area containing said shared edge.

5. The method of claim 1 further comprising replacing said localized exploded view with a default view on command from said user.

6. The method of claim 1 further comprising receiving additional input from said user indicating that said localized exploded view should be turned off, wherein said additional input is generated by said user clicking on a close button of said localized exploded view.

7. The method of claim 1, wherein the design application comprises:
a Computer Aided Design (CAD) program;
an Integrated Development Environment (IDE);
a Hypertext Markup Language (HTML) editor; or
a graphical design application.

8. A method for providing an Integrated Development Environment (IDE), the method comprising:
receiving input from a user identifying a boundary shared by two or more objects horizontally adjacent to one another, vertically adjacent to one another, or positioned so that one object is inside another within a layer in a design canvas, wherein said design canvas is a design canvas of said IDE, wherein said boundary includes two or more individual object edges; and
presenting said two or more individual object edges with spaces therebetween in a localized view that is superimposed on a portion of said design canvas, said localized view including magnification of at least portions of said two or more objects.

9. The method of claim 8, wherein said input is generated by the user dragging a visual object over said area of said design canvas.

10. The method of claim 8 wherein said localized view is a window superimposed on one or more of said objects.

11. The method of claim 8 wherein said localized view includes a portion of the length of said shared boundary not constrained to a window.

12. A computer program product having a computer readable storage medium having computer logic recorded thereon for implementing an Integrated Development Environment, the computer program product comprising:
code for providing a user with a design canvas including two or more objects positioned horizontally adjacent to one another, vertically adjacent to one another, or in a relationship in which one object is inside another in a layer of the design canvas so that individual edges of said objects form at least one common boundary;
code for receiving input from said user identifying said at least one common boundary;
code for rendering a view of said identified at least one common boundary, wherein one or more spaces are added between said individual edges, and wherein said view is constrained to a portion of said design canvas;
code for receiving input instructing the inclusion of an additional object between two of said individual edges; and
code for recalculating said view to include at least a portion of said additional object.

13. The computer program product of claim 12 wherein said view is limited to said common boundary.

14. The computer program product of claim 12 wherein said view comprises a pop-up window allowing said user to view said individual edges and said objects at the same time, said pop-up window providing magnification.

15. The computer program product of claim 12 wherein said view is semi-opaque and overlaps a portion of said design canvas.

16. The computer program product of claim 12 wherein said code for rendering a view of said common boundary includes code for presenting an animation of said individual edges separating from one another.

17. A computing system comprising a processor and a tangible computer-readable medium embodying program components, the program components comprising:
a design component that configures the computing system to present a design canvas comprising a first and second object within the same layer of the design canvas, the first and second object positioned horizontally adjacent to one another, vertically adjacent to one another, or positioned with the second object inside the first object, so that the first and second object share a common boundary including two or more object edges depicted in the design canvas as a single line;

an interface component that configures to computing system to receive input identifying the common boundary; and a localized exploded view component that configures the computing system to render a localized and exploded view of at least a portion of the common boundary on a portion of the design canvas, the view depicting the two or more object edges separated from one another by a space, the localized view component further configuring the computing system to allow placement of an additional object between two of said object edges.

\* \* \* \* \*